(12) United States Patent
Lee

(10) Patent No.: US 6,403,439 B1
(45) Date of Patent: Jun. 11, 2002

(54) METHOD OF PREPARING FOR STRUCTURAL ANALYSIS A DEEP TRENCH-TYPE CAPACITOR AND METHOD OF STRUCTURAL ANALYSIS THEREFOR

(75) Inventor: Thing-Jong Lee, Na-Tao Shen (TW)

(73) Assignees: Promos Technologies Inc.; Mosel Vitelic Inc., both of Hsinchu (TW); Infineon Technologies Inc., Munich (DE)

( * ) Notice: Subject to any disclaimer, the term of this patent is extended or adjusted under 35 U.S.C. 154(b) by 34 days.

(21) Appl. No.: 09/629,733

(22) Filed: Jul. 31, 2000

(51) Int. Cl.⁷ ................................................ H01L 21/20
(52) U.S. Cl. .................... 438/386; 438/14; 438/691; 438/692; 438/750
(58) Field of Search ................................ 438/386, 141, 438/750, 689, 691, 692

(56) References Cited

U.S. PATENT DOCUMENTS

| | | |
|---|---|---|
| 5,064,498 A | 11/1991 | Miller |
| 5,336,930 A * | 8/1994 | Quach |
| 5,925,576 A | 7/1999 | Peng |
| 6,071,823 A | 6/2000 | Hung et al. |
| 6,171,378 B1 * | 1/2001 | Manginell ..................... 96/143 |

* cited by examiner

Primary Examiner—Long Pham
(74) Attorney, Agent, or Firm—Stevens, Davis, Miller & Mosher, LLP

(57) ABSTRACT

A method of preparing for structural analysis a deep trench-type capacitor formed in a die employs a combination of mechanical and chemical action to expose the trench-type capacitors. The method of preparing the die includes the steps of (a) mechanically treating the die back side so as to remove a first portion of the substrate and leave intact a second portion of the substrate; (b) mounting the mechanically treated die by affixing the die by its top side to a mount; and (c) chemically treating the mounted die so as to remove the substrate second portion and provide a chemically treated die. By exposing the deep trench capacitors, the method facilitates the inspection of the device for the detection of possible structural defects such as metal shorts, capacitor holes, and particle failures. The method further overcomes the deficiencies associated with conventional methods of substrate removal, and facilitates inspection by a variety of methods. The method facilitates, for example, the detection of residual arsenic glass, and deep trench deformities, such as those associated with deep trench length and the thickness of the deep trench ON layer.

31 Claims, 3 Drawing Sheets

METHOD OF PREPARING FOR STRUCTURAL ANALYSIS A DEEP TRENCH-TYPE CAPACITOR AND METHOD OF STRUCTURAL ANALYSIS THEREFOR

BACKGROUND OF THE INVENTION

1. Field of the Invention

This invention relates generally to a method of preparing for structural analysis a deep trench (DT)-type capacitor, and a method of structural analysis therefor. The invention relates more specifically to a method of preparation which employs a combination of mechanical and chemical action to expose the trench-type capacitors for structural analysis.

2. Description of Related Art

Demands for miniaturization in the semiconductor industry require that a higher density of electronic devices such as capacitors be placed on a chip.

One solution to the demand for higher density capacitors is the use of trench-type capacitors. In a trench-type capacitor, advantage is taken of the depth of the substrate in order to place a high density pattern of capacitors on the semiconductor device. For example, U.S. Pat. No. 6,071,823 describes a method of fabricating a bottle-shaped deep trench in a semiconductor substrate.

For various reasons, different types of structural defects can occur during fabrication of the semiconductor. These include such defects as metal shorts, capacitor holes, particle failures, incomplete deep trench formation and deformation. Because the semiconductors have become so miniaturized, however, the ability to detect such structural defects has become more challenging.

One conventional method of preparing a deep trench capacitor for structural analysis for such possible defects is described in U.S. Pat. No. 5,064,498, which is incorporated by reference herein in its entirety. In this method, the silicon substrate of the chip is etched away, leaving the memory cells exposed for viewing. The method includes the steps of removing oxide from the backside of a semiconductor device, and placing the semiconductor device into a solution of choline and water. The solution etches away the substrate. The memory cells may be photographed and viewed by TEM and SEM techniques.

However, in this prior art process, it is difficult to control the chemical etching of the substrate to remove a precise thickness thereof; thus, the risk of removing the deep trench capacitor is great. Also, the chemical etching requires a long time to effect. Further, the reaction of the choline/water solution is slow and unstable, and it is difficult to determine the stop point.

Therefore, a need has existed for a technique which overcomes the above-described deficiencies associated with conventional methods.

SUMMARY OF THE INVENTION

It is an object of the present invention to provide for an efficient and reliable method of preparing a large area deep trench capacitor for three-dimensional analysis by SEM or optical microscopy, or lift-off from the die and removal to a carbon film grid for TEM observation.

More specifically, the present invention is directed to a method of preparing for structural analysis a deep trench-type capacitor formed in a semiconductor die, employing a combination of mechanical and chemical action to expose the trench-type capacitors. The method of preparing the die includes the steps of (a) mechanically treating the substrate disposed at the die back side so as to remove a first portion of the substrate and leave intact a second portion of the substrate; (b) mounting the mechanically treated die by affixing the die by its top side to a mount; and (c) chemically treating the die so as to remove the substrate second portion. By exposing the deep trench capacitors, the method facilitates the inspection of the device for the detection of possible structural defects such as metal shorts, capacitor holes, and particle failures. The method further overcomes the deficiencies associated with conventional methods of substrate removal, and facilitates inspection by a variety of methods. The method facilitates, for example, the detection of residual arsenic glass, and deep trench deformities, such as those associated with deep trench length and the thickness of the deep trench ON layer.

According to one aspect of the present invention, there is provided a method of preparing a deep trench-type capacitor for analysis, the deep trench capacitor being formed in a substrate of a semiconductor die comprising a top side and a back side, the method comprising the steps of (a) mechanically treating (for example, by polishing for a period of approximately 30 minutes with a diamond film) the back side of the die so as to remove a first portion of the substrate; (b) mounting the mechanically treated die by affixing the top side of the die to a mount (formed of for example silicon or glass construction); and (c) chemically treating the die so as to remove a second portion of the substrate to expose the at least one deep trench capacitor for three-dimensional observation.

The first portion of the substrate removed in step (a) may be a layer having a thickness of from 20 to 100 $\mu$m, and preferably a thickness of 60 $\mu$m. Step (b) may comprise affixing the top side of the die to the mount with an adhesive, such as an epoxy that is then allowed to dry for a period of from 30 to 120 minutes before proceeding to step (c).

Step (c) may comprise chemically treating by exposing the second portion of the substrate to a chemical solution, which may include organic and/or inorganic chemicals. The chemical solution may be a 6–50 wt % solution of KOH, and preferably a 16 wt % solution of KOH, having a temperature of from 25 to 80° C., for treating for a period of approximately 60 to 600 minutes. Step (c) may alternatively include chemically treating by exposing the second portion of the substrate to reactive ion etching (RIE) or by exposing the second portion of the substrate to plasma etching.

The method may further comprise after step (c) further steps including rinsing the chemically treated die for example with methyl alcohol or ethyl alcohol and drying the rinsed die for example at a temperature of from 100 to 150° C. for a period of from 3 to 5 seconds. The method may further comprise after step (c), a further step of removing the DT capacitor from the chemically treated die and affixing the removed DT device to a carbon film grid for TEM observation.

According to another aspect of the present invention, there is provided a method of analyzing the structure of a deep trench-type capacitor, the deep trench capacitor being formed in a substrate of a semiconductor die comprising a top side and a back side, the method comprising the steps of (a) mechanically treating the back side of the die so as to remove a first portion of the substrate; (b) mounting the mechanically treated die by affixing the top side of the die to a mount; (c) chemically treating the die so as to remove a second portion of the substrate to expose the at least one deep trench capacitor for three-dimensional observation;

and (d) performing a structural analysis of the at least one deep trench capacitor. Step (d) may include performing the structural analysis by a method selected from the group consisting of scanning electron microscopy and optical microscopy. The method may further include after step (c) and before step (d), a step of removing the DT capacitor from the chemically treated die and affixing the removed DT device to a carbon film grid for TEM observation. Step (d) may comprise performing the structural analysis by transmission electron microscopy.

According to another aspect of the present invention, there is provided a method of preparing for structural analysis a semiconductor device comprising at least one capacitor disposed in a substrate of a die, the method comprising chemically treating the substrate so as to remove the substrate by one of (i) exposing the substrate to a solution of KOH, (ii) reactive ion etching, and (iii) plasma etching, in order to expose the at least one capacitor for structural analysis. This method may further comprise, before the step of chemically treating, a step of mechanically treating the substrate so as to remove a first portion thereof and removing the at least one capacitor from the chemically treated die and affixing the removed DT device to a carbon film grid for TEM observation.

The present invention, therefore, provides a method of preparation which advantageously overcomes the deficiencies associated with conventional methods, and which is advantageously suitable for any service in which a simple and fast method of preparation is desired. The method facilitates, for example, the detection of residual arsenic glass, and deep trench deformities, such as those associated with deep trench length and the thickness of the deep trench ON layer.

Also, compared to the above-discussed technique of U.S. Pat. No. 5,064,498, the mechanical treatment to remove the first portion of the substrate according to the present invention facilitates more precise control of the thickness of the removed portion of the substrate and is quicker. Further, while the reaction of a choline/water solution is slow and unstable, with difficult determination of the stop point, the RON solution employed in the present invention is a common and safe solution.

BRIEF DESCRIPTION OF THE DRAWINGS

Other objects, features, and advantages of the present invention will become more fully apparent from the following detailed description of the preferred aspects, the appended claims, and the accompanying drawings. As depicted in the attached drawings:

DESCRIPTION OF THE PREFERRED ASPECTS OF THE INVENTION

The present invention will be described in terms of the currently perceived preferred aspects thereof.

The present invention is directed to a method of preparing for structural analysis a deep trench-type capacitor, and a method of structural analysis therefor.

In a first aspect of the invention, therefore, the invention relates to a method of preparing for structural analysis a deep trench-type capacitor formed in a die.

Figure 1:
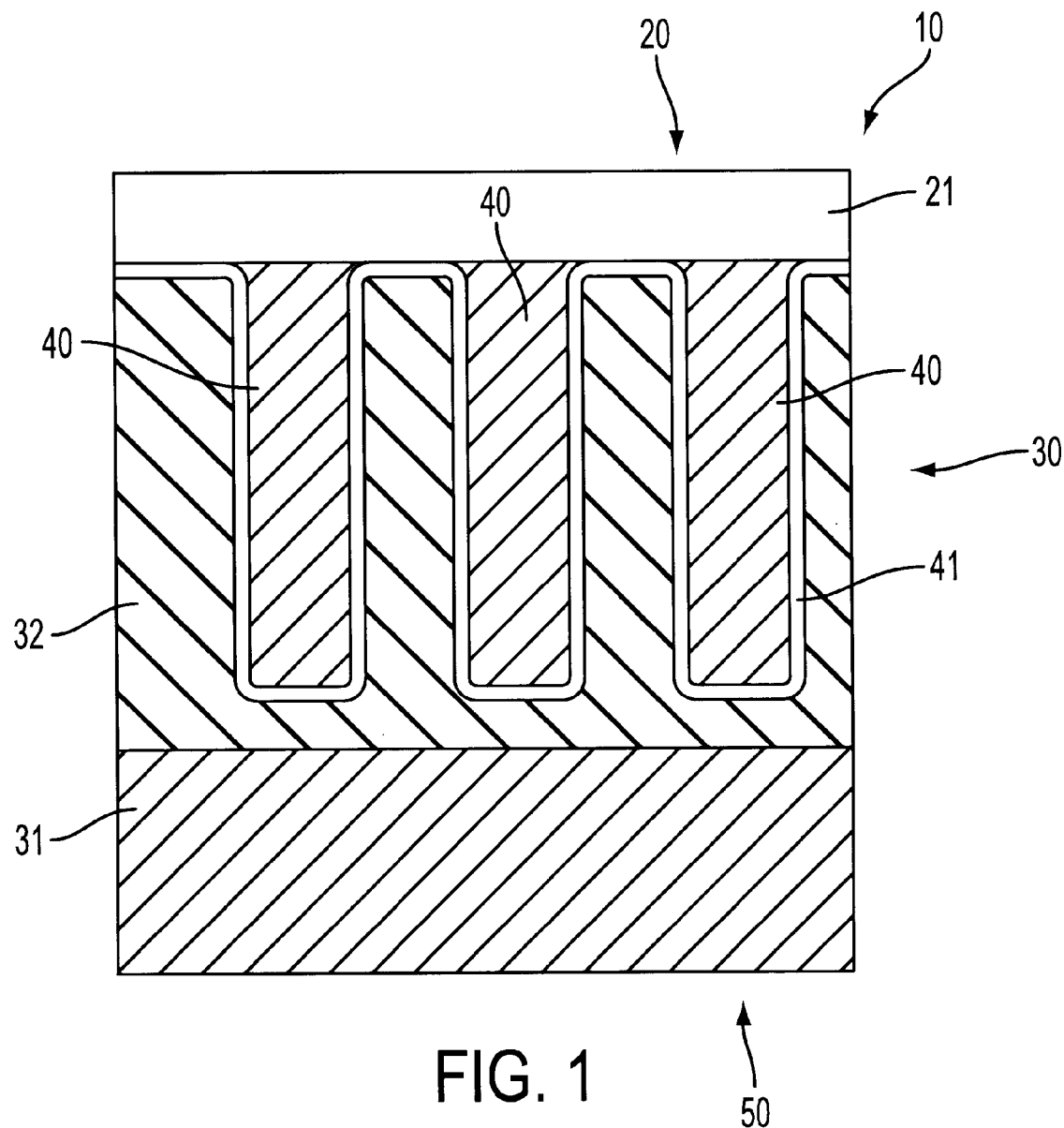
FIG. 1 is a side sectional view of a die having a plurality of deep trench capacitors disposed in a substrate of the die.
Figure 2:
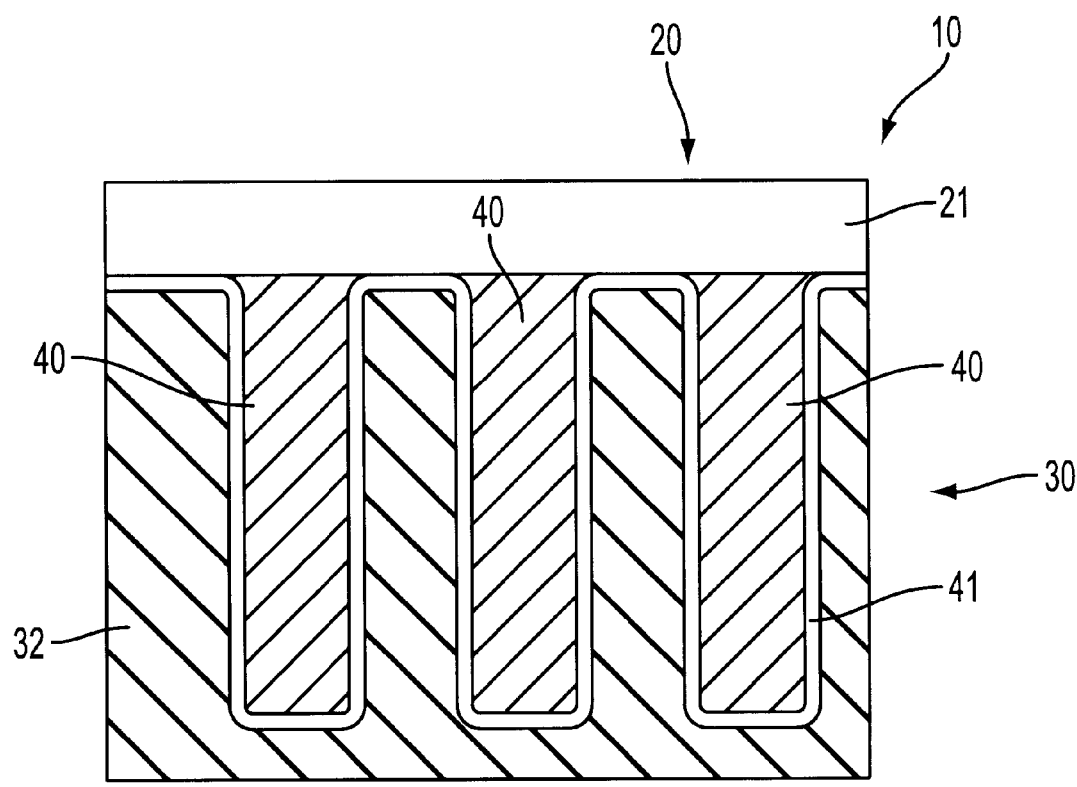
FIG. 2 is a side sectional view of a die from which a first portion of the substrate depicted in FIG. 1 has been removed according to an aspect of the present invention.
Figure 3:
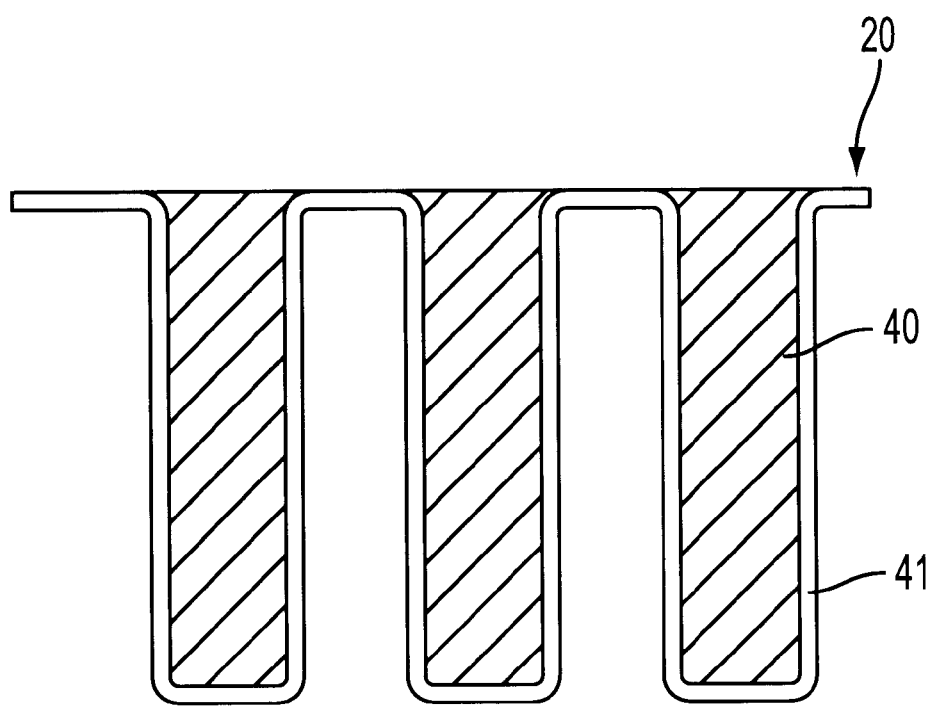
FIG. 3 is a side sectional view of a die from which a second portion of the substrate depicted in FIGS. 1 and 2 has been removed according to an aspect of the present invention.

Referring to FIG. 1, the die 10 comprises in general a die top side 20, a substrate 30, a plurality of deep trench capacitors 40 disposed in substrate 30, and a die back side 50. Reference numeral 41 denotes a dielectric of, for example, nitride/oxide, and reference numeral 21 denotes the top portion of the die including for example bit line, word lines, oxide layers, etc.

The method of preparing for structural analysis a deep trench-type capacitor formed on a die 10 comprises the steps of (a) mechanically treating the die back side 50 so as to remove the substrate first portion 31 and leave intact the substrate second portion 32; (b) mounting the mechanically treated die by affixing the die 10 by die top side 20 to a mount (not shown); and (c) chemically treating the mounted die so as to remove the substrate second portion 32 and provide a chemically treated die.

The mechanical treatment of step (a) serves to provide a bulk removal of the substrate first portion 31 down to a depth of the substrate which is close to the depth of, but not at, the depth of that end of the deep trench capacitors 40 disposed closest to die back side 50.

In a typical aspect, substrate first portion 31 removed in said step (a) is a layer having a thickness of from 20 to 100 $\mu$m; in a preferred aspect, first portion 31 removed in said step (a) is a layer having a thickness of 60 $\mu$m.

The mechanically treating step is typically effected by a method such as polishing. For example, by polishing with a diamond film for a period of approximately 30 minutes, the desired degree of polishing can be achieved.

The mounting performed in step (b) serves to secure the die for the subsequent processing steps. The step (b) affixing is typically effected with an adhesive, such as an epoxy. Representative epoxies include those such as GATAN G1, (commercially available from Gatan Corp., USA) or M-BOND 610, (commercially available from Measurement Group Inc., Raleigh, N.C., U.S.A.).

Depending upon the specific adhesive employed, the affixing step can require allowing the adhesive to dry for a period of typically from 30 to 120 minutes. For example, the GATAN G1 would typically require a drying period of approximately 30 minutes, while the M-BOND 610 would typically require a drying period of approximately 120 minutes.

The mount to which the die is affixed is typically of silicon or glass construction.

The chemical treatment of step (c) comprises removing the substrate second portion 32 by a method such as exposing the substrate second portion to a dilute chemical solution, or to reactive ion etching, or to plasma etching. This step serves to remove that portion of the substrate which envelops the deep trench capacitors, thereby exposing the individual deep trench capacitors, yet does so without damaging the capacitors.

The chemical solution employed in the chemically treating step is typically a dilute solution of a chemical such as KOH. A representative solution is, for example, a 6–50 wt % solution of KOH. Such a 6–50 wt % solution of KOH, and preferably a 16 wt % solution of KOH, would typically be employed at a temperature of from 25 to 80° C. for treating for a period of approximately 60 to 600 minutes, in order to effect the removal of substrate second portion 32.

In an optional aspect of the method of preparation, the method further comprises after step (c) the steps of (d)

rinsing the chemically treated die, and then (e) drying the rinsed die. This step ensures that any residual chemical solution employed in step (c) is removed.

The step (d) rinsing is typically effected with a rinse such as methyl alcohol or ethyl alcohol, and with such rinses, the step (e) drying is effected at a temperature of from 100 to 150° C. for a period of from 3 to 5 seconds.

In another optional aspect of the method of preparation, the method further comprises after step (c) a step of removing the DT capacitor from the die, followed by the step of affixing the removed device to a carbon film grid. This optional aspect of the method of preparation is employed then the subsequent structural analysis is to be performed by transmission electron microscopy.

In still another aspect of the method of preparation, the method comprises chemically treating the die so as to remove the substrate from the die, and thus provide a chemically treated semiconductor. Thus, in this aspect, the entire substrate is removed by chemical action alone. In this method of preparation, the step of chemically treating can comprise the aforementioned methods such as exposing the substrate to a dilute chemical solution, or to reactive ion etching (RIE), or to plasma etching.

In a second aspect of the invention, the invention relates to a method of analyzing the structure of a deep trench-type capacitor formed on a die.

The method of analyzing the structure comprises the steps of (a) mechanically treating the die back side SO so as to remove the substrate first portion 31 and leave intact the substrate second portion 32; (b) mounting the mechanically treated die by affixing the die 10 by die top side 20 to a mount; (c) chemically treating the substrate second portion 32 of the mounted die so as to remove the substrate second portion 32 and provide a chemically treated die; and (d) performing a structural analysis of the chemically treated die.

In this aspect of the method of analysis, the step (d) structural analysis is performed by a method selected from the group consisting of scanning electron microscopy and optical microscopy.

In an optional aspect of the method of analysis, the method further comprises after step (c) and before step (d) a step of removing the DT capacitor from the chemically treated die, and a step of affixing the removed device to a carbon film grid. This optional aspect of the method of analysis is employed when the structural analysis is to be performed by transmission electron microscopy.

The present invention, therefore, provides a method of preparation which advantageously overcomes the deficiencies associated with conventional methods, and which is advantageously suitable for any service in which a simple and fast method of preparation is desired. The method facilitates, for example, the detection of residual arsenic glass, and deep trench deformities, such as those associated with deep trench length and the thickness of the deep trench ON layer.

Although the invention has been exemplified as being suitable for use in conjunction with deep trench-type capacitors, one skilled in the art can appreciate that the invention could be employed in other services, such as, for example, the preparation for inspection of planar type DRAMs and other types of semiconductor devices.

While only certain preferred aspects of this invention have been shown and described by way of illustration, many modifications will occur to those skilled in the art and it is, therefore, desired that it be understood that it is intended herein to cover all such modifications that fall within the true spirit and scope of this invention.

For example, in one aspect, the chemical treatment is effected with a relatively dilute KOH solution. Instead of being the disclosed KOS solution, however, the chemical treating solution could be effected with another chemical agent which is both capable of removing the substrate, yet incapable of damaging the remainder of the semiconductor device.

The description is intended to illustrate and not limit the scope of the invention which is defined by the full scope of the appended claims, and which invention is entitled to protection within the full scope of the appended claims.

What is claimed is:

1. A method of preparing a deep trench-type capacitor for analysis, said deep trench capacitor being formed in a semiconductor die comprising at least one said deep trench capacitor, a top side and a back side, and a subtract, said method comprising the steps of:

(a) mechanically treating said back side of said die so as to remove a first portion of said substrate;

(b) mounting said mechanically treated die by affixing said top top side of said die to a mount; and (c) chemically treating said die so as to remove a second portion of said substrate to expose said at least one deep trench capacitor for three-dimensional observation.

2. A method according to claim 1, wherein said first portion of said substrate removed in said step (a) is a layer having a thickness of from 20 to 100 $\mu$m.

3. A method according to claim 1, wherein said first portion of said substrate removed in said step (a) is a layer having a thickness of 60 $\mu$m.

4. A method according to claim 1, wherein step (a) comprises mechanically treating by polishing.

5. A method according to claim 4, wherein said polishing is performed for a period of approximately 30 minutes.

6. A method according to claim 4, wherein said polishing is effected with a diamond film.

7. A method according to claim 1, wherein step (b) comprises affixing said top side of said die to said mount with an adhesive.

8. A method according to claim 7, wherein said adhesive is an epoxy.

9. A method according to claim 7, further comprising allowing said adhesive to dry for a period of from 30 to 120 minutes before proceeding to step (c).

10. A method according to claim 1, wherein said mount is of silicon or glass construction.

11. A method according to claim 1, wherein step (c) comprises chemically treating by exposing said second portion of said substrate to a chemical solution.

12. A method according to claim 11, wherein said chemical solution is a 6–50 wt % solution of KOH.

13. A method according to claim 12, wherein said chemical solution is a 16 wt % solution of KOH.

14. A method according to claim 12, wherein said chemical solution has temperature of from 25 to 80° C.

15. A method according to claim 13, wherein said chemical solution has temperature of from 25 to 80° C.

16. A method according to claim 14, wherein step (c) is preformed for a period of approximately 60–600 minutes.

17. A method according to claim 15, wherein step (c) is preformed for a period of approximately 60–600 minutes.

18. A method according to claim 1, wherein step (c) comprises chemically treating by exposing said second portion of said substrate to reactive ion etching.

19. A method according to claim 1, wherein step (c) comprises chemically treating by exposing said substrate second portion to plasma etching.

20. A method according to claim 1, further comprising after said step (c):

(d) rinsing said chemically treated die; and (e) drying said rinsed die.

21. A method according to claim 20, wherein said step (d) rinsing is effected with methyl alcohol or ethyl alcohol.

22. A method according to claim 20, wherein said step (e) drying is effected at a temperature of from 100 to 150° C. for a period of from 3 to 5 seconds.

23. A method according to claim 1, further comprising after said step (c), a further step of removing said deep trench capacitor from said die, and a step of affixing said removed deep trench capacitor to a carbon film grid.

24. A method of analyzing the structure of a deep trench capacitor, said deep trench capacitor being formed in a semiconductor die comprising at least one said deep trench capacitor, a top side and a back side, and a substrate, said method comprising the steps of:

(a) mechanically treating said back side of said die so as to remove a first portion of said substrate;

(b) mounting said mechanically treated die by affixing said top side of said die to a mount;

(c) chemically treating said die so as to remove a second portion of said substrate to expose said at least one said deep trench capacitor for three-dimensional observation; and (d) performing a structural analysis of said at least one said deep trench capacitor.

25. A method according to claim 24, wherein step (d) comprises performing said structural analysis by a method selected from the group consisting of scanning electron microscopy and optical microscopy.

26. A method according to claim 24, further comprising after said step (c) and before said step (d), a step of removing said deep trench capacitor from said die, and a step of affixing said removed deep trench capacitor to a carbon film grid.

27. A method according to claim 25, wherein step (d) comprises performing said structural analysis by transmission electron microscopy.

28. A method of preparing a semiconductor device for structural analysis, said method comprising:

(a) providing one or a plurality of capacitors disposed in a die having a substrate;

(b) mechanically treating said substrate so as to remove a first portion thereof;

(c) chemically treating said die mechanically treated in step (b) so as to remove said substrate by one of
(i) exposing said substrate to a dilute solution of KOH,
(ii) reactive ion etching, and
(iii) plasma etching, in order to expose said one or a plurality of capacitors for structural analysis.

29. A method according to claim 1, wherein in step (a) said first portion of substrate is removed to a depth which is less than a depth of an end of said at least one said deep trench capacitor disposed closest to said back side of said die without exposing said at least one said deep trench capacitor.

30. A method according to claim 24, wherein in step (a) said first portion of substrate is removed to a depth which is less than a depth of an end of said at least one deep trench capacitor disposed closest to said back side of said die without exposing said at least one deep trench capacitor.

31. A method according to claim 28, wherein in step (a) said first portion of substrate is removed to a depth which does not expose any of said one or said plurality of capacitors.

* * * * *